United States Patent
Fornara et al.

(10) Patent No.: US 9,121,896 B2
(45) Date of Patent: Sep. 1, 2015

(54) DEVICE FOR DETECTING THE THINNING DOWN OF THE SUBSTRATE OF AN INTEGRATED CIRCUIT CHIP

(71) Applicant: STMicroelectronics (Rousset) SAS, Rousset (FR)

(72) Inventors: Pascal Fornara, Pourrieres (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 17 days.

(21) Appl. No.: 14/082,818

(22) Filed: Nov. 18, 2013

(65) Prior Publication Data

US 2014/0070829 A1 Mar. 13, 2014

Related U.S. Application Data

(62) Division of application No. 12/797,897, filed on Jun. 10, 2010, now Pat. No. 8,618,821.

(30) Foreign Application Priority Data

Jun. 15, 2009 (FR) .................................. 09 53968

(51) Int. Cl.
*G01R 27/08* (2006.01)
*G01R 31/28* (2006.01)
(Continued)

(52) U.S. Cl.
CPC .......... *G01R 31/2851* (2013.01); *G01L 9/0042* (2013.01); *G06K 19/07363* (2013.01);
(Continued)

(58) Field of Classification Search
CPC .... G01R 31/28; G01R 31/2851; G01R 33/12;
G06F 21/86; G01B 7/16; G01B 7/18; G01L 9/0042; G06K 19/07363; G06K 19/07381; H01L 2924/0002; H01L 2924/00014; H01L 2924/3011; H01L 2924/09701
USPC .......... 324/706, 705, 525, 526, 657, 725, 98; 257/48, 147, E23.141; 73/754, 774, 73/777

See application file for complete search history.

(56) References Cited

U.S. PATENT DOCUMENTS 3,961,900 A 6/1976 Gintella et al.
4,016,644 A 4/1977 Kurtz
(Continued)

FOREIGN PATENT DOCUMENTS

JP 2001168282 A 6/2001

OTHER PUBLICATIONS

French Search Report dated Jan. 21, 2010 from corresponding French Application No. 09/53968 filed Jun. 15, 2009.
(Continued)

*Primary Examiner* — Tung X Nguyen
*Assistant Examiner* — Thang Le
(74) *Attorney, Agent, or Firm* — Seed IP Law Group PLLC

(57) ABSTRACT

A device for detecting the thinning down of the substrate of an integrated circuit chip, including, in the active area of the substrate, bar-shaped diffused resistors connected as a Wheatstone bridge, wherein: first opposite resistors of the bridge are oriented along a first direction; the second opposite resistors of the bridge are oriented along a second direction; and the first and second directions are such that a thinning down of the substrate causes a variation of the imbalance value of the bridge.

16 Claims, 3 Drawing Sheets

(51) Int. Cl.
 *G01L 9/00* (2006.01)
 *G06K 19/073* (2006.01)
 *H01L 21/66* (2006.01)
 *H01L 23/00* (2006.01)

(52) U.S. Cl.
 CPC .......... *G06K19/07381* (2013.01); *H01L 22/34* (2013.01); *H01L 23/576* (2013.01); *H01L 2924/0002* (2013.01)

(56) References Cited

U.S. PATENT DOCUMENTS

| | | | |
|---|---|---|---|
| 4,618,397 A | 10/1986 | Shimizu et al. | |
| 4,975,390 A * | 12/1990 | Fujii et al. | 438/53 |
| 5,060,261 A | 10/1991 | Avenier et al. | |
| 6,006,607 A * | 12/1999 | Bryzek et al. | 73/727 |
| 7,015,706 B2 * | 3/2006 | Hattori et al. | 324/725 |
| 7,490,522 B2 | 2/2009 | Ruehrig et al. | |
| 7,992,448 B2 | 8/2011 | Shimazu et al. | |
| 2002/0017138 A1 | 2/2002 | Ueyanagi et al. | |
| 2002/0171111 A1 | 11/2002 | Haruhana et al. | |
| 2004/0164753 A1 * | 8/2004 | Hettori et al. | 324/725 |
| 2006/0043508 A1 | 3/2006 | Ohta et al. | |
| 2007/0228500 A1 | 10/2007 | Shimazu et al. | |
| 2008/0278217 A1 * | 11/2008 | Hankhofer et al. | 327/509 |
| 2008/0286944 A1 | 11/2008 | Thill | |
| 2009/0007686 A1 * | 1/2009 | Sumigawa et al. | 73/777 |
| 2010/0181999 A1 * | 7/2010 | Sudai et al. | 324/239 |
| 2010/0187527 A1 * | 7/2010 | Van Geloven et al. | 257/48 |

OTHER PUBLICATIONS

Jeffrey C Suhling et al:, *Silicon Piezoresistive Stress Sensors and Their Application in Electronic Packaging*, IEEE Sensors Journal, IEEE Service Center, New York, NY, US, vol. 1, No. 1, Jun. 1, 2001, pp. 14-30, XP011055568.

Kasbari M et al:, *Embedded Stress Sensors for Strained Technologies Process Control*, IEEE Transactions on Semiconductor Manufacturing, IEEE Service Center, Pis Cataway, NJ, US, vol. 21, No. 3, Aug. 1, 2008, pp. 352-357, XP011232426.

Kanda Y: *A Graphical Representation of the Piezoresistance Coefficients in Silicon*, IEEE Transactions on Electron Devices, IEEE Service Center, Pisacataway, NJ, US, vol. ED-29, No. 1, Jan. 1, 1982, pp. 64-70, XP000673850.

* cited by examiner

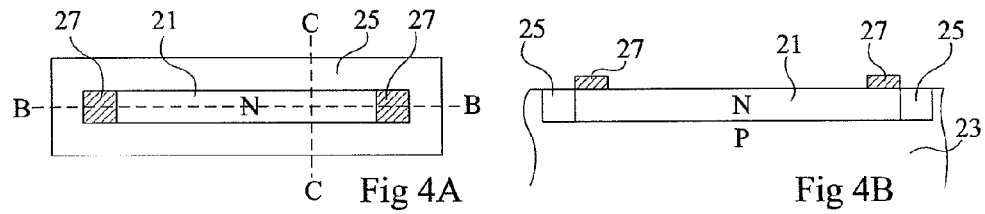
Fig 4A    Fig 4B
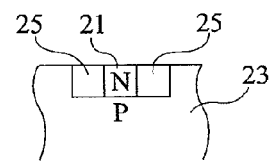
Fig 4C
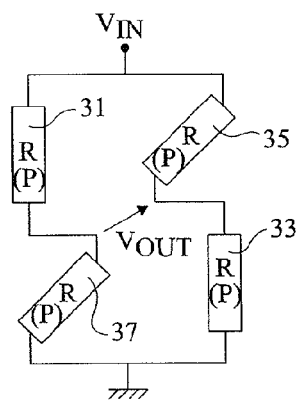 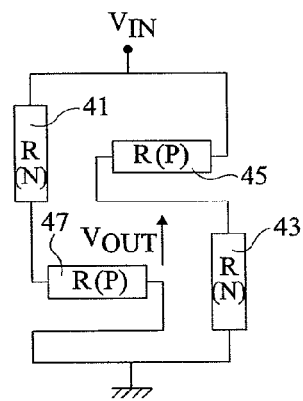 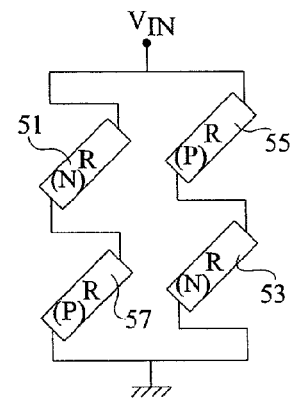
Fig 5    Fig 6    Fig 7

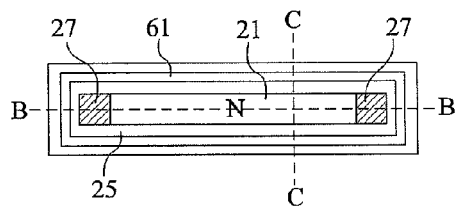
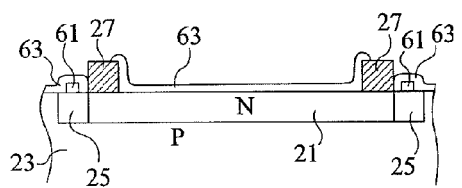
Fig 8A            Fig 8B
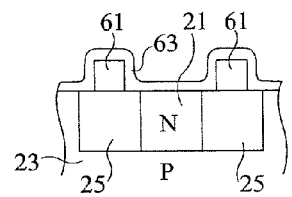
Fig 8C
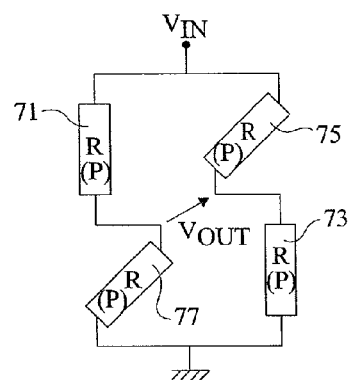
Fig 9

DEVICE FOR DETECTING THE THINNING DOWN OF THE SUBSTRATE OF AN INTEGRATED CIRCUIT CHIP

CROSS REFERENCE TO RELATED APPLICATIONS

This application is a division of U.S. patent application Ser. No. 12/797,897, filed Jun. 10, 2010, which application claims the priority benefit of French patent application number 09/53968, filed on Jun. 15, 2009, which applications are hereby incorporated by reference to the maximum extent allowable by law.

BACKGROUND OF THE INVENTION

1. Field of the Invention

The present invention relates to the protection of an integrated circuit chip against laser attacks. It more specifically aims at the detection of the thinning down of the chip substrate which is carried out before performing a laser attack.

2. Discussion of the Related Art

FIG. 1 is a simplified cross-section view of an integrated circuit chip 1 comprising a semiconductor support substrate 3, comprising in its upper portion an active layer 5 in which are formed electronic components, not shown. Substrate 3 is currently covered with a stack of insulating layers 7. Conductive interconnection tracks 9 are formed between insulating layers. There generally exist several successive interconnection levels, for example, three, M1 to M3, in the shown example. Conductive vias, not shown, cross the insulating layers to connect the conductive tracks to one another, to input-output terminals 11 of the chip, and to components of active area 5, thus forming the circuit interconnects.

In secure devices, for example, payment cards, some regions of active area 5 are capable of processing and/or storing critical data, for example, ciphering keys. Such devices may be subject to fraudulent manipulations aiming at obtaining protected confidential data.

Among known attacks, so-called "fault attacks" comprise deliberately disturbing the operation of a chip, and analyzing the effect of the disturbances on its behavior. The attacker is especially interested in the influence of disturbances on data such as output signals, power consumption, or response times. He is likely to deduce therefrom, by statistical studies or others, critical data such as the algorithms used and possibly the ciphering keys. To deliberately cause faults in the circuits of a chip, an attack mode comprises bombarding areas of the chip with a laser beam. It is thus possible to inject faults into certain memory cells and/or to alter the operation of certain components. It should be noted that in a laser attack, the chip should be powered.

FIG. 2 is a simplified cross-section view of chip 1 of FIG. 1 illustrating a preliminary step where substrate 3 is thinned down, which is necessary to carry out a laser attack. To make the components of active region 5 accessible to the laser beam, the attacker needs to remove part of the thickness of support substrate 3. As an example, a chip formed from a substrate having a 180-µm thickness will have its thickness decreased by on the order of 150 µm before a laser attack.

To ensure protection against tampering, an attack detection device coupled to a protection circuit is generally provided in secure chips. When an attack is detected, the protection circuit implements measures of protection, alienation, or destruction of the critical data. For example, it may be provided, when an attack is detected, to interrupt the power supply of the chip or to reset it, in order to reduce the time for which the attacker can study the chip response to a disturbance.

Attack detection solutions may be logical. They, for example, comprise regularly introducing into the calculations integrity tests enabling to make sure that the data have not been modified from the outside. Such solutions have the disadvantage of introducing additional calculation steps, thus increasing the chip response times. Further, integrity tests cannot detect all the disturbances caused by an attacker. The latter thus has a leeway likely to enable him to acquire critical data.

Other so-called physical attack detection solutions especially comprise sensors sensitive to temperature variations, to ultraviolet rays, or to X rays, enabling to detect suspicious activities. Like logic solutions, such solutions are not perfectly reliable. Indeed, the attacker has a leeway before the attack has been detected, during which he may be able to obtain critical data. Further, such solutions are expensive and difficult to implement.

SUMMARY OF THE INVENTION

Thus, an object of an embodiment of the present invention is to provide a device for detecting a laser attack, which overcomes at least some of the disadvantages of prior art solutions.

An object of an embodiment of the present invention is to provide a device enabling to detect the attack before the attacker is able to analyze the chip response to laser disturbances.

An object of an embodiment of the present invention is to detect the thinning down of the chip support substrate, which is carried out before performing a laser attack.

An object of an embodiment of the present invention is to provide a low-cost solution, easy to implement with usual manufacturing methods.

Thus, an embodiment of the present invention provides a device for detecting the thinning down of the substrate of an integrated circuit chip, comprising, in the active area of the substrate, bar-shaped diffused resistors connected as a Wheatstone bridge, wherein: first opposite resistors of the bridge are oriented along a first direction; the second opposite resistors of the bridge are oriented along a second direction; and the first and second directions are such that a thinning down of the substrate causes a variation of the imbalance value of the bridge.

According to an embodiment of the present invention, the main surfaces of the substrate are in plane [001] of the crystal structure of the substrate.

According to an embodiment of the present invention: the diffused resistors are formed in a substrate region of a first conductivity type; and the first and second directions respectively correspond to directions (100) and (110) of the crystal structure of the substrate.

According to an embodiment of the present invention: the first opposite resistors are formed in a substrate region of a first conductivity type; said second opposite resistors are formed in a substrate region of the second conductivity type; and the first and second directions respectively correspond to directions (100) and (010) of the crystal structure of the substrate.

According to an embodiment of the present invention: the first opposite resistors are formed in a substrate region of a first conductivity type; the second opposite resistors are formed in a substrate region of the second conductivity type;

and the first and second directions are parallel to direction (110) of the crystal structure of the substrate.

According to an embodiment of the present invention: the diffused resistors are formed in a P-type doped substrate region; the first and second directions respectively correspond to directions (100) and (110) of the crystal structure of the substrate; and the second opposite resistors are each surrounded with an insulating region covered with a polysilicon layer, the entire resistor being covered with a protection nitride layer.

According to an embodiment of the present invention: the diffused resistors are formed in a N-type doped substrate region; the first and second directions respectively correspond to directions (100) and (110) of the crystal structure of the substrate; and the first opposite resistors are each surrounded with an insulating region covered with a polysilicon layer, the entire resistor being covered with a protection nitride layer.

Another embodiment of the present invention provides a circuit for detecting the thinning down of the substrate of an integrated circuit comprising: at least one device for detecting the thinning down of the substrate according to any of the above-mentioned embodiments; means for measuring the imbalance of this device.

According to an embodiment of the present invention, at least one comparator compares the imbalance value of said at least one device with a threshold, the output state of the detection circuit being based on the output value of this comparator.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 4A to 4C are simplified top and cross-section views showing an embodiment of a resistor;

FIGS. 5 to 7 are simplified top views of three embodiments of a device for detecting the thinning down of the substrate of a chip;

FIGS. 8A to 8C are simplified top and cross-section views showing an embodiment of a resistor; and FIG. 9 is a simplified top view showing another embodiment of a device for detecting the thinning down of the substrate of a chip.

DETAILED DESCRIPTION

Figure 1:
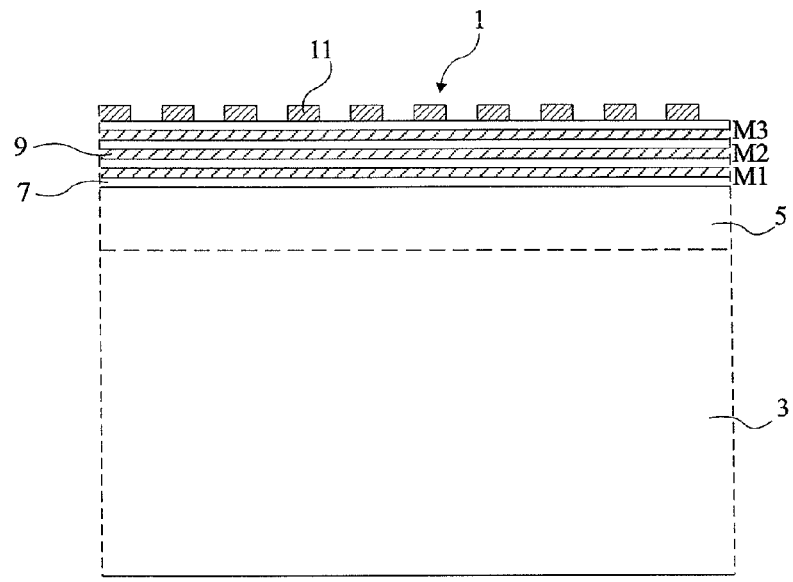
FIG. 1, previously described, is a simplified cross-section view of an integrated circuit chip portion.
Figure 2:
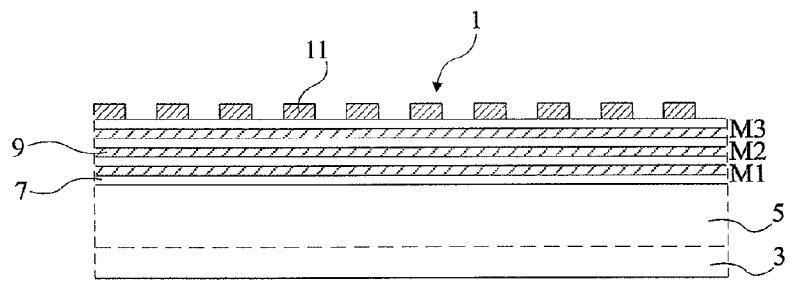
FIG. 2, previously described, is a simplified cross-section view of the chip portion of FIG. 1 after thinning down of its substrate.

For clarity, the same elements have been designated with the same reference numerals in the different drawings and, further, as usual in the representation of integrated circuits, the various cross-section and top views are not drawn to scale.

Figure 3:
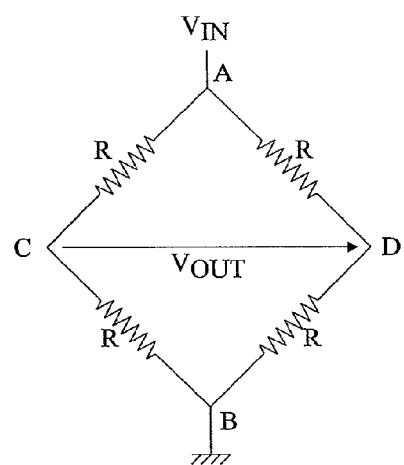
FIG. 3 shows the electric diagram of a Wheatstone bridge.

FIG. 3 shows the electric diagram of a Wheatstone bridge formed of four resistors, for example, of same value R. A first voltage $V_{IN}$ is applied to a first diagonal of the bridge, between nodes A and B. An imbalance voltage $V_{OUT}$ may appear across a second diagonal of the bridge, between nodes C and D.

Normally, the Wheatstone bridge is balanced and output voltage $V_{OUT}$ is independent from the value of $V_{IN}$ and from possible temperature variations, for example, close to 0 V.

FIG. 4A is a top view schematically showing an embodiment of a diffused resistor. FIGS. 4B and 4C are cross-section views of FIG. 4A along axes B-B and C-C. An N-type doped area 21 is formed in the upper portion of a region 23 of a lightly-doped P-type semiconductor substrate. In top view, area 21 has the shape of a rectangular bar. An oxide region 25 is arranged at the periphery of area 21 to delimit the resistor. Conductive pads 27 are arranged in contact with the ends of resistive area 21. All the above-mentioned conductivity types may be inverted.

The semiconductor substrate, typically made of silicon, has piezoresistive properties, that is, its conductibility varies according to the mechanical stress to which it is submitted. Now, the substrate thinning preceding a laser attack modifies the stress exerted in the active layer of the chip. Accordingly, the resistance value is likely to vary when the substrate is thinned down. Thus, to detect a thickness variation, it is here provided to detect a resistance variation.

FIG. 5 is a simplified top view of an embodiment of a device for detecting the thinning down of a chip substrate. This device, formed in the active chip area, comprises a Wheatstone bridge formed of four resistors 31, 33, 35, 37 of same value R. Resistors 31, 33, 35, 37 are diffused resistors, formed in a P-type semiconductor substrate, as described in relation with FIGS. 4A to 4C. A single-crystal silicon substrate having its main surface in a crystal plane [001], that is, a plane orthogonal to crystal direction (001), is here considered. Opposite resistors 31 and 33 are parallel to each other and are oriented, in Miller notation, along direction (100). Opposite resistors 35 and 37 are parallel to each other and are oriented along direction (110). Resistors 31, 33, 35, 37 are thus arranged in the same plane [001], directions (100) and (110) forming a 45° angle.

When the substrate is thinned down to be prepared for a laser attack, the stress variations in the active area are likely to affect resistors oriented along different directions differently. Resistors 31 and 33, oriented along axis (100), remain substantially unchanged. However, resistors 35 and 37, oriented along axis (110), undergo a significant variation. Thus, the thinning down of the substrate causes a variation in the imbalance value of the bridge. As an example, output voltage $V_{OUT}$ of the bridge varies by a factor 4 when 150 μm are removed from a 180-μm substrate (for example, from 20 mV to 80 mV).

If the four resistors were oriented along the same direction, the stress variations in the substrate would affect all resistors substantially in the same way in case of a thinning down of the substrate. The imbalance value of the Wheatstone bridge would thus remain unchanged.

If the resistors were formed in a semiconductor N-type substrate having its main surface also in a plane [001], the resistors oriented along a direction (110) would remain substantially unchanged in case of a thinning down of the substrate. However, the resistors oriented along a direction (100) would undergo a significant variation. Thus, the imbalance value of the bridge would be sensitive to the thinning down of the substrate.

At least one embodiment of the present invention also provides means, not shown, for measuring the imbalance value of the Wheatstone bridge. According to an embodiment, the measurement means comprise comparators comparing output voltage $V_{OUT}$ respectively with a positive threshold, for example 50 mV, and with a negative threshold, for example, 50 mV. When the bridge imbalance exceeds a threshold, the output of the substrate thinning-down detection circuit changes, thus for example stopping the chip operation. It may, for example, be chosen to perform the imbalance voltage measurements periodically, at each starting of the chip, or continuously, when the chip is powered.

FIG. 6 is a simplified top view of an alternative embodiment of a device for detecting the thinning down of a chip substrate. This device, formed in the active chip area, comprises a Wheatstone bridge formed of four resistors 41, 43, 45, 47, of same value R. Resistors 41, 43, 45, 47, are diffused resistors, formed as described in relation with FIGS. 4A to 4C in a substrate having its main surface formed in a plane [001]. Opposite resistors 41 and 43 are formed in a lightly-doped N-type region of the substrate. Resistors 41 and 43 are oriented, in Miller notation, along direction (100). Opposite resistors 45 and 47 are formed in a lightly-doped P-type substrate region. Resistors 45 and 47 are oriented along direction (010).

When the substrate is thinned down to be prepared for a laser attack, resistors 41 and 43, oriented along direction (100), undergo a significant variation. However, resistors 45 and 47, oriented along direction (010), remain substantially unchanged. Thus, the thinning down of the substrate causes a variation in the bridge imbalance value.

FIG. 7 is a simplified top view of an alternative embodiment of a device for detecting the thinning down of a chip substrate. This device, formed in the active chip area, comprises a Wheatstone bridge formed of four resistors 51, 53, 55, 57, of same value R. Resistors 51, 53, 55, 57 are diffused resistors formed as described in relation with FIGS. 4A to 4C in a substrate having its main surface in a plane [001]. Opposite resistors 51 and 53 are formed in a lightly-doped N-type substrate region. Opposite resistors 55 and 57 are formed in a lightly-doped P-type substrate region. Resistors 51, 53, 55, and 57 are oriented along direction (010).

When the substrate is thinned down to be prepared for a laser attack, resistors 51 and 53 undergo a significant variation. However, resistors 55 and 57 remain substantially unchanged. Thus, the thinning down of the substrate causes a variation of the imbalance value of the bridge.

Of course, the present invention is not limited to the configurations described in relation with FIGS. 5 to 7. It will be within the abilities of those skilled in the art to implement the desired operation by orienting the Wheatstone bridge resistors differently. However, to obtain good detection performances, the bridge should have a good sensitivity to stress variations generated by the substrate thinning-down. Generally, first opposite resistors of the bridge should be particularly sensitive to stress variations caused by the substrate thinning-down. However, the second opposite resistors of the bridge should remain substantially unchanged when the substrate is thinned down. The inventors have determined that the above-described configurations exhibit optimal detection performances for a [001] silicon substrate. Of course, if the main surface of the substrate is not in a plane [001], other orientations providing a maximum variability according to the stress likely to be created by a thinning down will be selected.

FIG. 8A is a top view schematically representing an embodiment of a diffused resistor, formed in the active layer of a chip. FIGS. 8B and 8C are cross-section views of the resistor of FIG. 8A along axes B-B and C-C. The resistor of FIGS. 8A to 8C is similar to the resistor of FIGS. 4A to 4C. It further comprises a polysilicon layer 61 on the surface of insulating region 25. Layer 61 corresponds to the maintaining on insulating region 25 of a portion of an insulated polysilicon layer, forming insulated gates of MOS transistors at other locations of the integrated circuit. Further, a protection nitride layer 63 may be maintained, to cover the entire resistor except for conductive pads 27.

FIG. 9 is a simplified top view of a device for detecting the thinning down of a chip substrate. This device comprises a Wheatstone bridge formed of four resistors 71, 73, 75, 77 of same value R, formed in a P-type semiconductor substrate having its main surface in a plane [001]. Opposite resistors 71 and 73 are diffused resistors formed as described in relation with FIGS. 4A to 4C. Opposite resistors 75 and 77 are diffused resistors having their insulation region covered with polysilicon, formed as described in relation with FIGS. 8A to 8C. Resistors 71 and 73 are oriented along direction (100). Resistors 75 and 77 are oriented along direction (110).

Such a device has improved substrate thinning down detection performance with respect to the device described in relation with FIG. 5. Indeed, the polysilicon and nitride layers present in resistors 75 and 77 amplify the sensitivity of these resistors to stress variations in the active area.

An advantage of the use of Wheatstone bridges as thinning-down detection elements lies in the fact that imbalance value $V_{OUT}$ is independent from the circuit temperature. Indeed, although the resistance values are likely to vary along with temperature, the undergone drift is the same for all the resistors of a same bridge, at least in the case where all resistors have the same doping type. Thus, the balancing remains unchanged.

According to an advantage of an embodiment of the present invention, the provided solution is compatible with usual manufacturing methods and requires no additional manufacturing steps.

Specific embodiments of the present invention have been described. Various alterations and modifications will occur to those skilled in the art. In particular, the present description mentions a circuit for detecting the thinning down of the substrate of a chip comprising a Wheatstone bridge and means for measuring the imbalance of this bridge. It will also be within the abilities of those skilled in the art to form a detection circuit comprising several Wheatstone bridges. Further, it will be within the abilities of those skilled in the art to implement the desired operation whatever the conductivity type of the semiconductor substrate in which the Wheatstone bridges resistors are formed. Further, the present invention is not restricted to the bridge imbalance detection means discussed in the present description. It will be within the abilities of those skilled in the art to implement the desired operation whatever the Wheatstone bridge imbalance measurement means used. Moreover, the present description mentions Wheatstone bridges formed of four resistors of same value. It will be within the abilities of those skilled in the art to implement the desired operation by using normally balanced Wheatstone bridges in which the resistors do not all have the same value.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method, comprising:
   detecting thinning of a substrate having an integrated circuit, the substrate having a first surface and a second surface, the integrated circuit being formed on the first surface, the detecting of the thinning corresponding to thinning of the second surface, the detecting including:

measuring an output voltage of a bridge circuit in the substrate, the bridge circuit including a first resistor connected between a voltage and a first node, a second resistor connected between the first node and ground, a third resistor connected between the voltage and a second node, and a fourth resistor connected between the second node and ground, the first and fourth resistors having different sensitivity to the thinning of the substrate than the second and third resistors; and detecting the thinning of the substrate by analyzing the output voltage from the bridge circuit.

2. The method of claim 1, wherein the first and fourth resistors each have a length that extends in a first direction, and the second and third resistors each have a length that extends in a second direction that is different from the first direction.

3. The method of claim 1, wherein the first and fourth resistors are formed in a substrate region of the substrate having a first conductivity type and the second and third resistors are formed in a substrate region of the substrate having a second conductivity type.

4. The method of claim 1, wherein the first and fourth resistors have a first conductivity type, and the second and third resistors have a second conductivity type.

5. The method of claim 4, wherein the first, second, third, and fourth resistors each have a length that extends in a first direction.

6. The method of claim 1, wherein the first, second, third, and fourth resistors each include a plurality of conductive pads, a resistive region, and an insulating region, the bridge circuit further including a polysilicon layer formed on the insulating regions of the first and fourth resistors.

7. The method of claim 1, further comprising stopping operation of the integrated circuit in response to the detecting of the thinning of the substrate.

8. The method of claim 1, further comprising detecting the thinning of the substrate periodically, continuously, or upon powering on of the integrated circuit.

9. The method of claim 1, wherein the first, second, third, and fourth resistors have the same conductivity type.

10. The method of claim 9, wherein the first and fourth resistors each have a length that extends in a first direction, and the second and third resistors each have a length that extends in a second direction.

11. A method, comprising:

detecting thinning of a substrate having an integrated circuit, the substrate having a first surface and a second surface, the integrated circuit being formed on the first surface, the detecting of the thinning of the substrate corresponding to thinning of the second surface, the detecting including:

measuring an output voltage of a bridge circuit formed in the substrate, the bridge circuit, including:

first and second resistors having a first conductivity type; and third and fourth resistors having a second conductivity type, the first and second resistors having different sensitivity to the thinning of the substrate than the third and fourth resistors; and detecting the thinning of the substrate by analyzing the output voltage from the bridge circuit.

12. The method of claim 11, wherein resistivities of the first, second, third, and fourth resistors are substantially equal.

13. The method of claim 11, wherein the first and second resistors each have a length that extends in a first direction, and the third and fourth resistors each have a length that extends in a second direction.

14. The method of claim 11, wherein the first, second, third, and fourth resistors each have a length that extends a first direction.

15. The method of claim 11, wherein the first resistor is connected to an input voltage and the fourth resistor, the third resistor is connected to the input voltage and the second resistor, and the second and fourth resistors are connected to a ground.

16. The method of claim 11, further comprising stopping operation of the integrated circuit in response to the detecting of the thinning of the substrate.

* * * * *